United States Patent [19]

Takahashi et al.

[11] 4,163,201
[45] Jul. 31, 1979

[54] ELASTIC SURFACE WAVE DEVICE

[75] Inventors: Sadao Takahashi, Tokyo; Toshio Sudo, Yokohama, both of Japan

[73] Assignee: Tokyo Shibaura Electric Co., Ltd., Kawasaki, Japan

[21] Appl. No.: 849,945

[22] Filed: Nov. 9, 1977

[30] Foreign Application Priority Data

Nov. 9, 1976 [JP] Japan .................. 51-133720
Nov. 9, 1976 [JP] Japan .................. 51-133721

[51] Int. Cl.² .................. H03H 9/26; H03H 9/32; H01L 41/18
[52] U.S. Cl. .................. 333/194; 252/62.9; 333/195
[58] Field of Search .................. 333/30 R, 72, 71; 310/313; 252/62.9

[56] References Cited

U.S. PATENT DOCUMENTS 3,818,382  6/1974  Holland et al. .................. 310/313 X
4,001,767  1/1977  Slobodnik, Jr. .................. 333/30 R X

OTHER PUBLICATIONS

Warner et al., —"Determination of Elastic and Piezoelectric Constants for Crystals in Class (3M)", in the Journal of the Acoustical Society of America, vol. 42, No. 6, 1967, pp. 1223-1231.

Primary Examiner—Alfred E. Smith
Assistant Examiner—Marvin Nussbaum
Attorney, Agent, or Firm—Frishauf, Holtz, Goodman and Woodward

[57] ABSTRACT

An elastic surface wave device comprises an X-cut LiTaO$_3$ substrate whose thickness satisfies the expression $$\frac{2.13n}{f_l} < d < \frac{2.13(n + 2)}{f_u}$$

where
n: 1, 3, 5 . . . (odd number)
$f_l$: a minimum frequency (MHz) of a filter pass band
$f_u$: a maximum frequency (MHz) of a filter pass band
d: a thickness (mm) of the LiTaO$_3$ substrate and transducers provided on one surface of the substrate.

4 Claims, 16 Drawing Figures

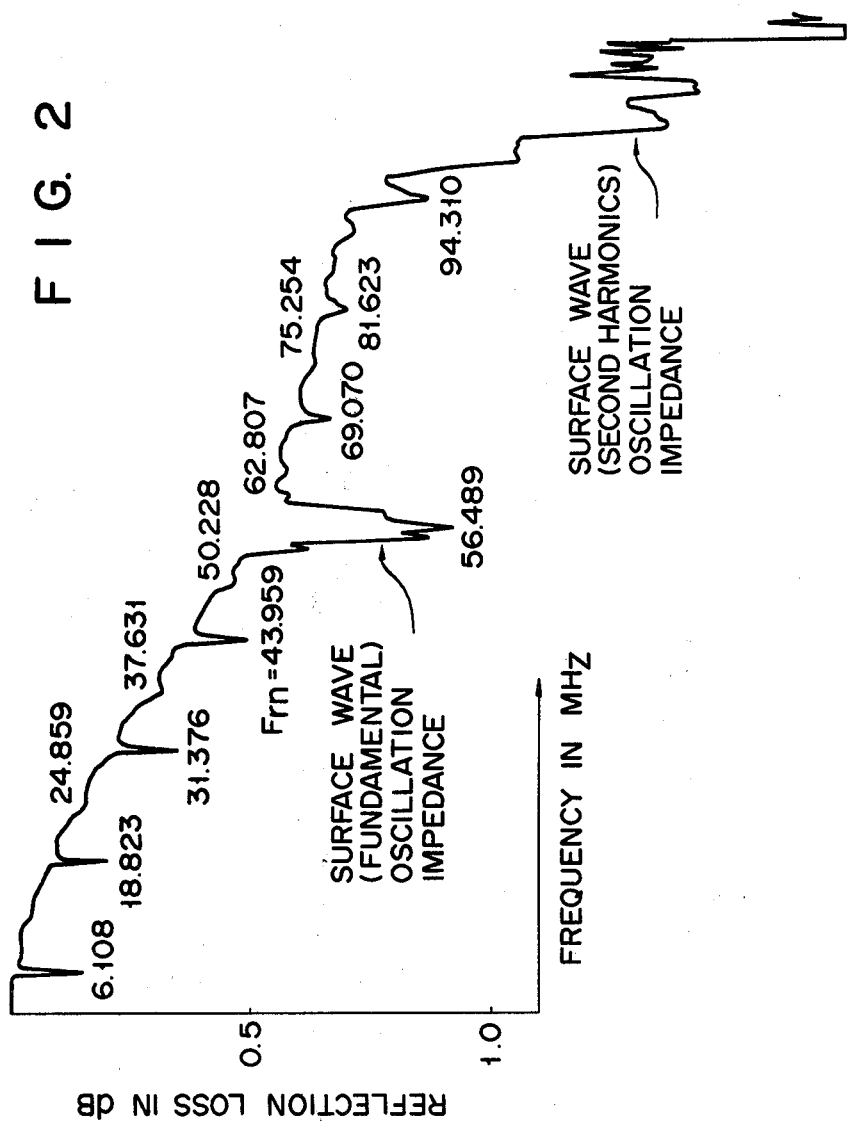

n=1 n=3 n=5 n=7

ELASTIC SURFACE WAVE DEVICE

BACKGROUND OF THE INVENTION

This invention relates to an elastic surface wave device using an X-cut LiTaO$_3$ substrate as a piezoelectric substrate.

It would be contemplated to apply an elastic surface wave device to a picture intermediate frequency (PIF) filter circuit of a television receiver. In this case, a ceramic or LiNbO$_3$ substrate is normally examined for a piezoelectric substrate of the elastic surface wave device. The ceramic substrate, however, is poor in the manufacturing yield and unsuitable to an industrial application, whereas the LiNbO$_3$ substrate manifests a poor temperature characteristic and it is unsuited as the PIF filter of the television receiver.

The inventors have developed the use of a LiTaO$_3$ substrate. The LiTaO$_3$ substrate is high in cost and, coupled with no available proper cutting method, it has not been put to practice. The inventors have discovered that the temperature characteristic and bulk spurious characteristic are prominently improved by setting the direction of propagation of an elastic surface wave at an angle of 67.8 to 142° to the Y-axis of the LiTaO$_3$ crystal. If in this case the substrate has no proper configuration, the spurious characteristic is not yet improved and there is a consequent poor yield. This proves a bar to the realization of such devices.

By way of example, a PIF filter for a TV set was manufactured using as a piezoelectric substrate an X-cut LiTaO$_3$ substrate whose surface wave is propagated in a 112° direction to the Y-axis of the substrate. The frequency (MHz)-relative response output characteristic was measured, the result of which is as shown in FIG. 1. The curve A of FIG. 1 indicates the frequency characteristic of the PIF filter band when the relative response output (dB) is plotted in units of 10dB. From FIG. 1 it appears that no apparent great ripple emerges, but when the relative response output is plotted in units of 1dB for the 10-fold sensitivity, a relatively great ripple is observed, as indicated by the curve B, over 56 to 57 Hz of the corresponding filter pass band.

For a filter of the frequency characteristic of FIG. 1 the reflection characteristic measured by using a network analyzer is as shown in FIG. 2. From FIG. 2 it will be seen that, in addition to the excitation of a fundamental wave and 2nd order harmonics of the surface wave, a strong resonance occurs at a plurality of frequency positions such as 6.108, 18.823, 31.376, 43.959 and 56.489 MHz. When such a resonance occurs in the PIF filter pass band, a surface wave excitation energy is absorbed by the resonance, with the resultant possible ripples in the PIF filter pass band. When the resonant frequency agrees with a trap frequency requiring a greater attenuation, no requisite attenuation will be obtained.

It is accordingly the object of this invention to provide an elastic surface wave device which, based on the consideration of FIGS. 1 and 2, can beforehand prevent the absorption of bulk spurious response excitation energies due to resonance to reduce ripples i.e. spurious components.

SUMMARY OF THE INVENTION

According to this invention there is provided a spurious component-free surface wave device using as a piezoelectric substrate an X-cut LiTaO$_3$ substrate whose thickness satisfies the following expression $$\frac{2.13n}{f_l} < d < \frac{2.13(n+2)}{f_u}$$

BRIEF DESCRIPTION OF THE DRAWINGS

FIG. 2 is a curve as obtained by using a network analyzer for the frequency characteristic of FIG. 1;

DETAILED DESCRIPTION

Figure 1:
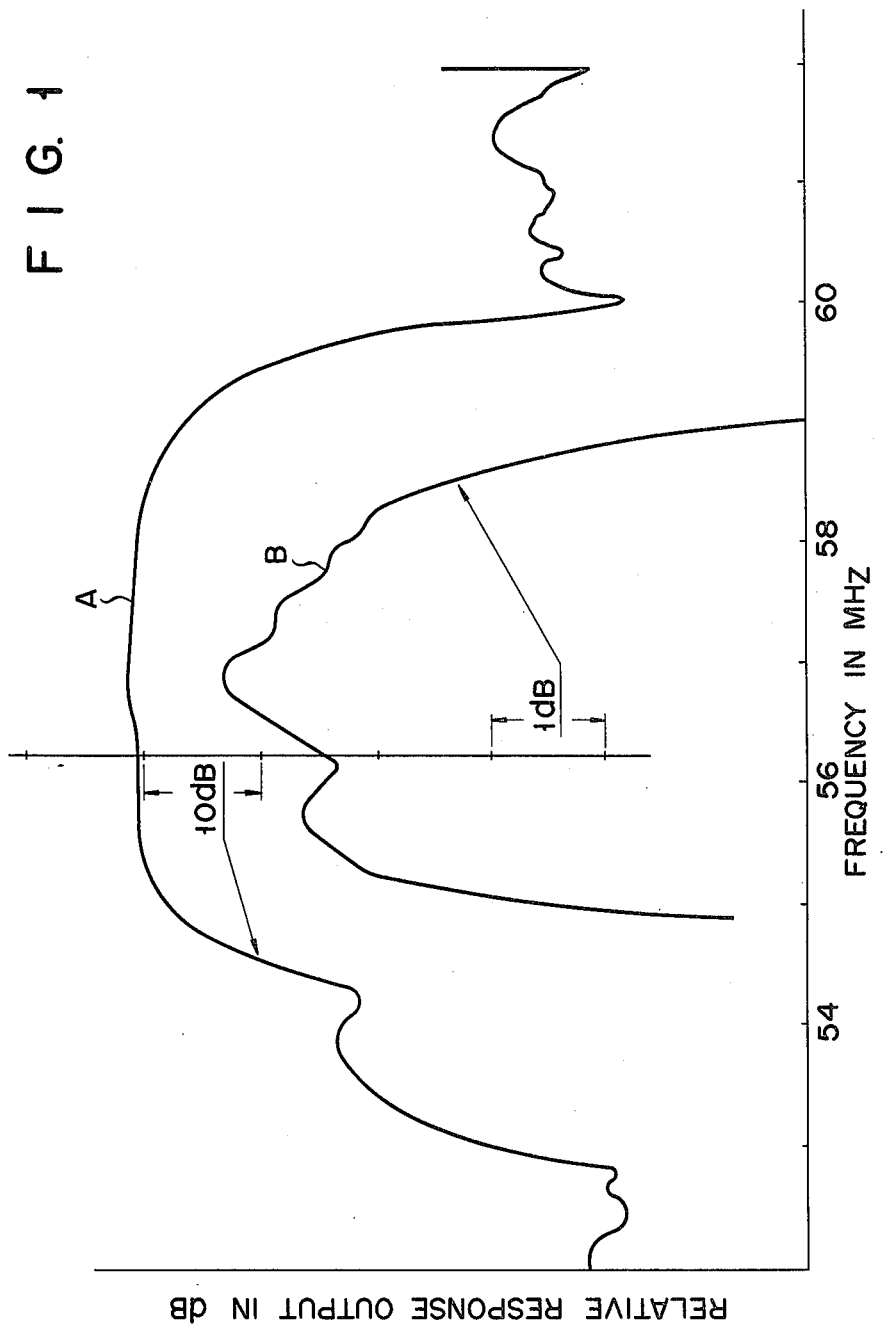
FIG. 1 is a curve showing the relative response output-frequency characteristic of a TV receiver PIF filter formed of a LiTaO$_3$ piezoelectric substrate.
Figure 3A:
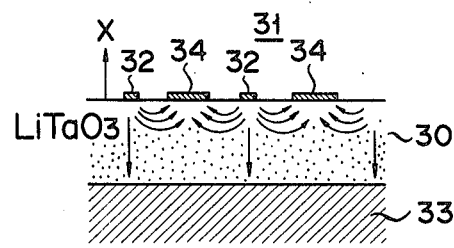
FIGS. 3A to 3C show the aspect of an internal electric field when different interdigital transducers are excited.
Figure 3B:
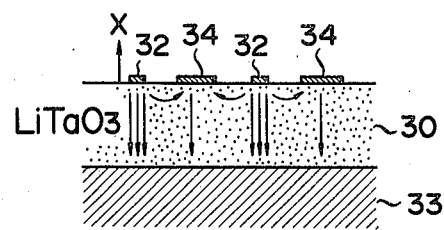
Figure 3C:
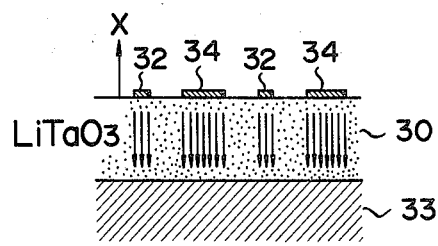
Figure 4:
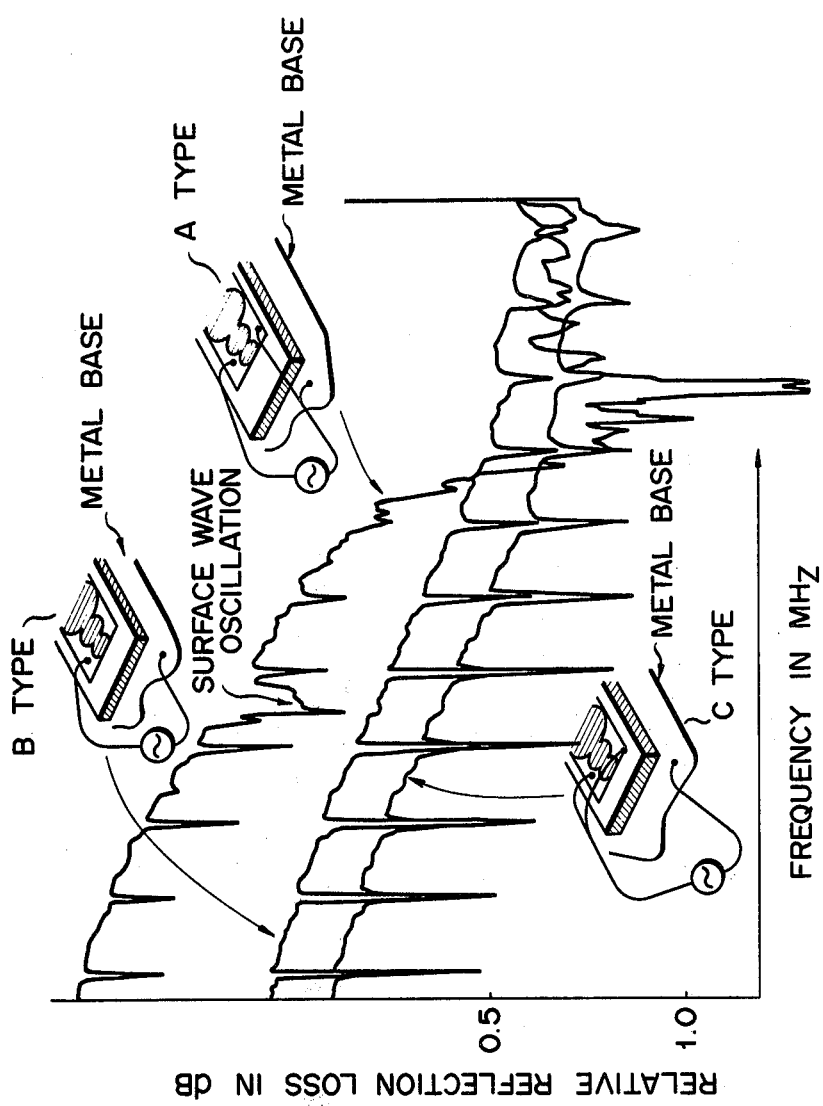
FIG. 4 is a characteristic curve showing a relative reflection loss-frequency relation for the cases of FIGS. 3A to 3C.

Prior to the explanation of the instant embodiment, the principle of this invention will be analytically explained. In order to understand the vibration mode of spurious components, the interdigital transducer is excited in the following three ways. The arrangements for the three ways of excitation are shown in FIGS. 3 and 4. FIGS. 3A, 3B and 3C correspond to the types A, B and C in FIG. 4, respectively.

(A) As shown in FIG. 3A one electrode 32 of the interdigital transducer 31 is connected to a metal base 33 for grounding, and an excitation voltage is applied between the one electrode 32 and another electrode 34.

(B) As shown in FIG. 3B, the electrode 34 of the interdigital transducer 31 is used as a "float" electrode and an excitation voltage is applied between the electrode 32 and the metal base 33 of the package.

(C) As shown in FIG. 3C, both electrodes 32 and 34 of the interdigital transducer 31 are connected in parallel with each other and an excitation voltage is applied between one terminal of the parallel connection and the metal base 33.

The cases (A), (B) and (C) are indicated in the form of models in FIGS. 3A, 3B and 3C, respectively. The lines of electric forces are indicated by arrows in these Figures.

The reflection characteristics were measured, as shown in FIG. 4, by using the methods (A), (B) and (C). The following results were found:

1. The surface waves were excited only when the method (A) is used.
2. The resonance frequency of spurious components are the same for each method used.
3. The odd-order harmonics show strong excitation.
4. The excitation strength of spurious components has a relation of (A)<(B)<(C).

From the above it will be understood that the excitation of spurious components results from an electric field in the X-axis direction of the substrate. This was ascertained by the fact that the spurious response exhibited, as expected, a sharp decline when the piezoelectric chip was moved away from the metal base 33.

Then, the thickness d of the piezoelectric chip and the shape of the interdigital transducer were varied to examine a corresponding relation to the resonant frequency. The results of such tests are shown in Tables 1 to 5 and FIG. 5. Note that the shape of the electrode is referred to as the name of a mask used upon the manufacture of the electrode. Table 1 indicates the test results of a sample I of a thickness d of 0.340 mm as obtained by using 1MT-25B-3288 as the mask.

Table 1

| n | $f_{rn}$(MHz) | $f_{rn}d/n$(MHz . mm) | $f_{rn}d$(MHz . mm) |
|---|---|---|---|
| 1 | 5.915 | 2.01 | 2.011 |
| 3 | 18.75 | 2.13 | 6.375 |
| 5 | 31.32 | 2.13 | 10.649 |
| 7 | 43.94 | 2.13 | 14.940 |
| 9 | 56.49 | 2.13 | 19.207 |
| 11 | 69.05 | 2.13 | 23.477 |
| 13 | 81.58 | 2.13 | 27.737 |

Note:
$f_{rn}$(MHz) = n-order frequency
n = order

Table 2 shows the test results of a sample II of a thickness d of 0.340 mm as obtained when IMT-25B-3288 was used as the mask.

Table 2

| n | $f_{rn}$(MHz) | $f_{rn}d/n$(MHz . mm) | $f_{rn}d$(MHz . mm) |
|---|---|---|---|
| 1 | 6.108 | 2.08 | 2.077 |
| 3 | 18.823 | 2.13 | 6.399 |
| 5 | 31.376 | 2.13 | 10.668 |
| 7 | 43.959 | 2.14 | 14.946 |
| 9 | 56.489 | 2.13 | 19.206 |
| 11 | 69.070 | 2.13 | 23.484 |
| 13 | 81.623 | 2.13 | 27.752 |

Table 3 shows the test results of a sample III of a thickness d of 0.323 mm as obtained by using 1MT-25B-3288 as the mask.

Table 3

| n | $f_{rn}$(MHz) | $f_{rn}d/n$(MHz . mm) | $f_{rn}d$(MHz . mm) |
|---|---|---|---|
| 1 |  |  |  |
| 3 | 19.598 | 2.11 | 6.330 |
| 5 | 32.665 | 2.11 | 10.551 |
| 7 | 45.762 | 2.11 | 14.781 |
| 9 |  |  |  |
| 11 | 71.868 | 2.11 | 23.213 |
| 13 | 84.975 | 2.11 | 27.447 |

Table 4 shows the test results of a sample IV of a thickness d of 0.458 mm as obtained by using 1MT-301A-3291 as the mask.

Table 4

| n | $f_{rn}$(MHz) | $f_{rn}d/n$(MHz . mm) | $f_{rn}d$(MHz . mm) |
|---|---|---|---|
| 1 | 4.488 | 2.06 | 2.056 |
| 3 | 14.034 | 2.14 | 6.428 |
| 5 | 23.460 | 2.15 | 10.745 |
| 7 | 32.913 | 2.15 | 15.074 |
| 9 | 42.305 | 2.15 | 19.376 |
| 11 | 51.723 | 2.15 | 23.689 |
| 13 | 61.110 | 2.15 | 27.988 |

Table 5 shows the test results of a sample V of a thickness d of 0.290 mm as obtained by using 1MT-301A-3291 as a mask.

Table 5

| n | $f_{rn}$(MHz) | $f_{rn}d/n$(MHz . mm) | $f_{rn}d$(MHz . mm) |
|---|---|---|---|
| 1 | 6.977 | 2.02 | 2.023 |
| 3 | 22.056 | 2.13 | 6.396 |
| 5 | 36.867 | 2.14 | 10.691 |
| 7 | 51.704 | 2.14 | 14.994 |
| 9 | 66.446 | 2.14 | 19.269 |
| 11 |  |  |  |
| 13 |  |  |  |

As will be seen from Tables 1 to 5, $f_{rn}d/n$ shows a substantial constant value of about 2.13. This is ascertained by the fact that the relation of $f_{rn}d$ and n reveals a substantially straight line and that the inclination $f_{rn}d/n$ becomes 2.13. The indication of such constant value implies that the resonant vibration of the spurious component is what is called a "thickness vibration". The displacement distribution of the thickness vibration for n=1, n=3, n=5 and n=7, when plotted, will be as shown in FIGS. 6A, 6B, 6C and 6D. For the thickness vibration of the X-cut LiTaO3 substrate, the coupling coefficient of the thickness shear mode shows a great value of 44%. It is said that its frequency constant (i.e., the product of the thickness of the substrate and the frequency) is 1.908 MHz.mm.

Figure 5:
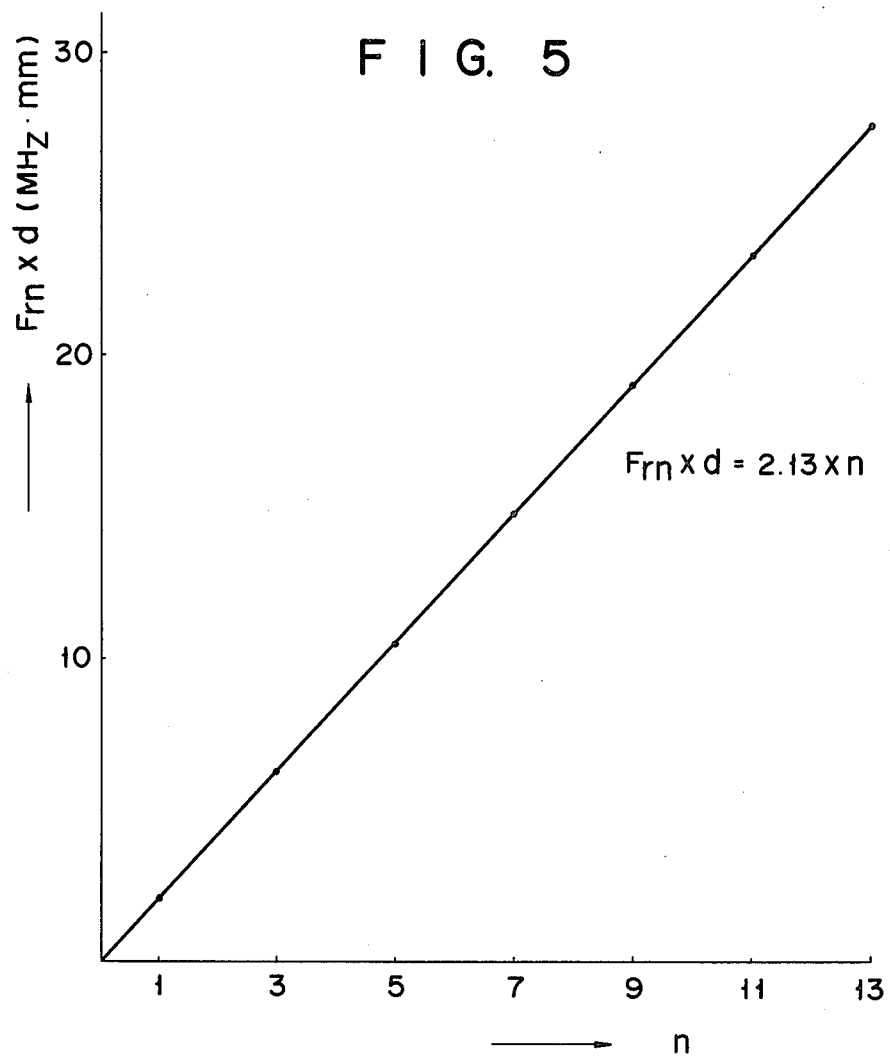
FIG. 5 is a characteristic graph showing a relation of the product of the order n of a resonant frequency and the thickness d of an n-order resonant frequency.
Figure 7:
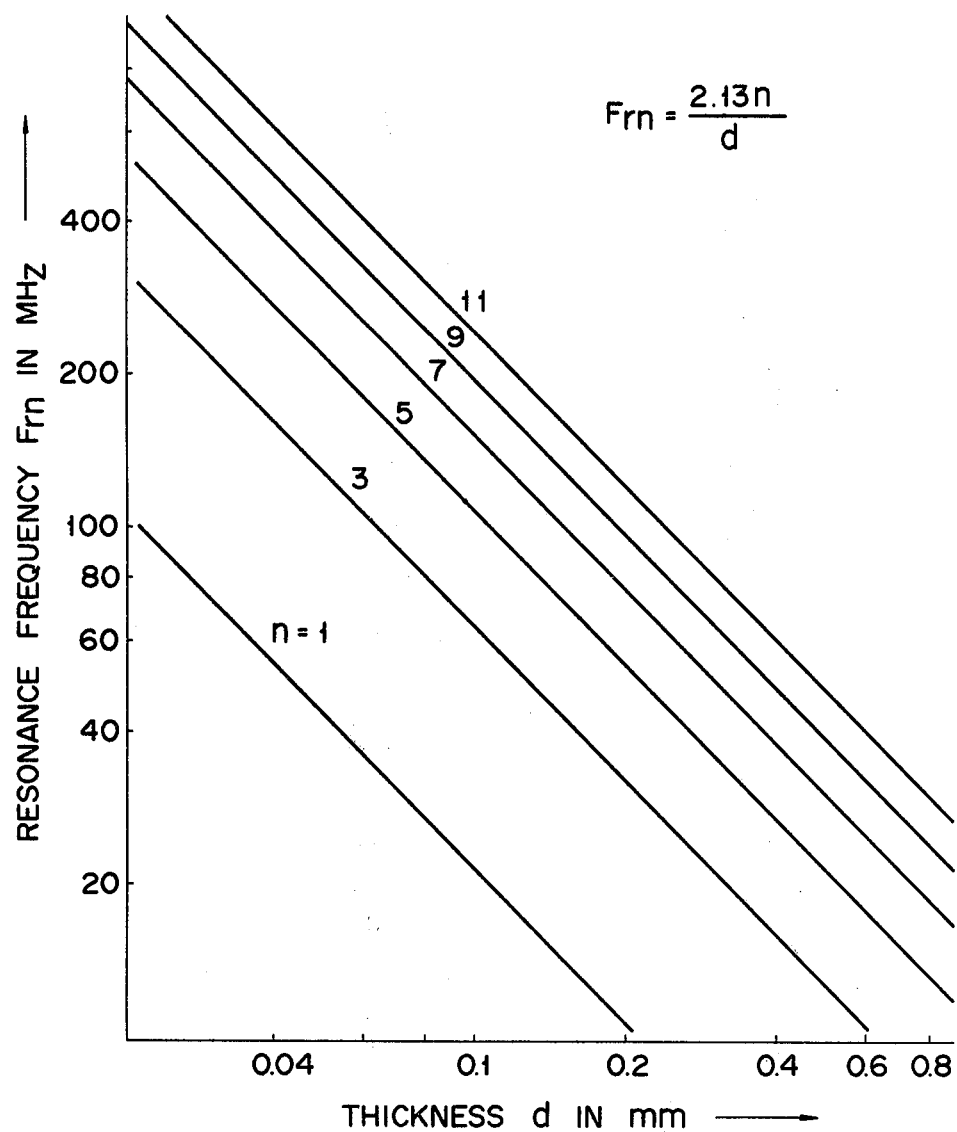
FIG. 7 is a characteristic view showing a relation of the n-order resonant frequency to the thickness of a LiTaO$_3$ substrate of the instant invention.

When the minimal point of the above-mentioned reflection is regarded as the resonant frequency, the frequency constant of this invention becomes 2.13 MHz.mm as will be evident from Tables 1 to 5 and FIG. 5. A discrepancy between the normally used frequency constant, i.e. 1.907 MHz.mm, and the frequency constant, i.e. 2.13 MHz, of this invention is not clear, but the spurious resonant mode under consideration is properly regarded as the thickness shear mode. A relation between the resonant frequency $f_{rn}$ and the thickness d of the piezoelectric substrate using such frequency constant (2.13 MHz.mm) was found, the results of which are shown in FIG. 7.

As explained above it has been found that the spurious vibration of the X-cut LiTaO3 piezoelectric substrate is a thickness shear mode in the X-axis direction. In consequence, the thickness d of the substrate may be so selected that the resonance does not pass through the filter pass band and thus it imparts no adverse influence to the characteristic of the elastic wave filter.

Figure 8:
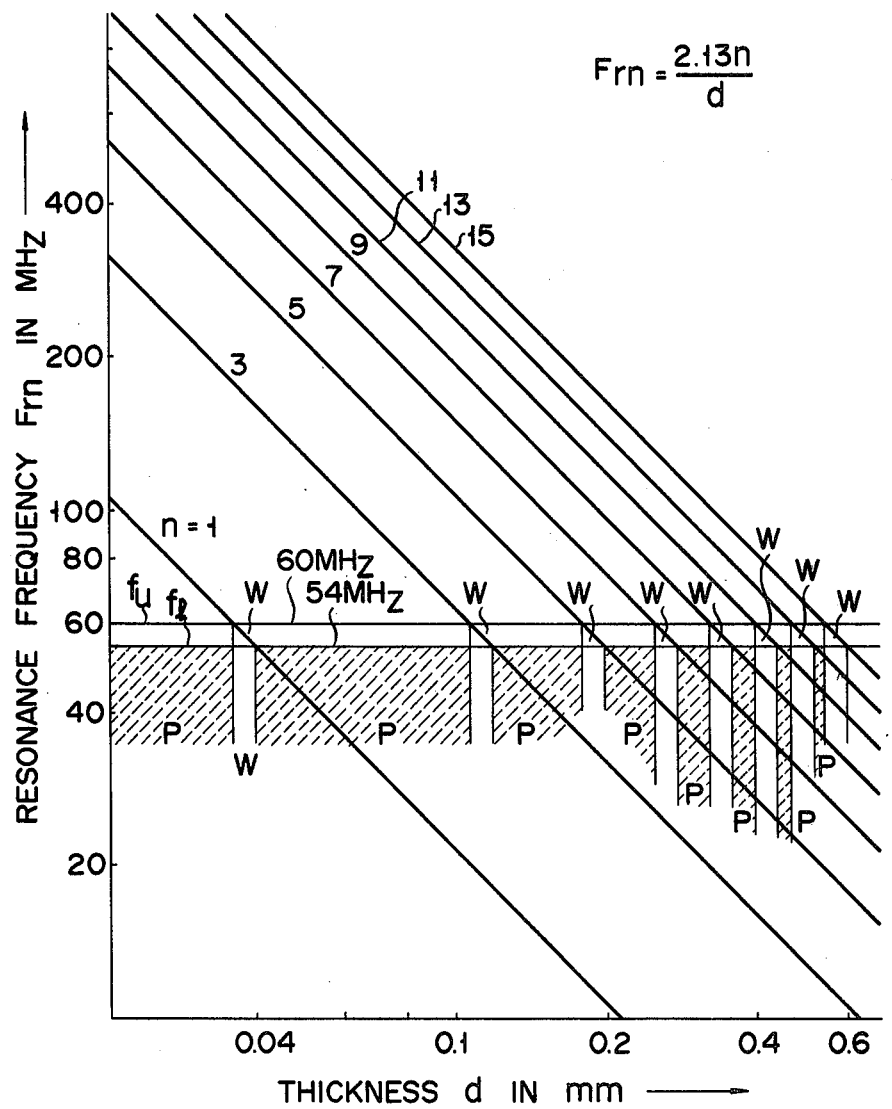
FIG. 8 is a characteristic view showing a suitable range of a thickness d when use is made of a PIF filter whose pass band is in a range of $f_l$ to $f_u$.

FIG. 8 shows a relation of the PIF filter pass band to the thickness d of a color TV receiver PIF filter to which this invention is applied. Since the PIF filter pass band ranges, for example, from 54 MHz (minimum pass frequency $f_l$) to 60 MHz (maximum pass frequency $f_u$), i.e., over 6 MHz, the spurious component can be beforehand eliminated by selecting the thickness d within dashed cross-hatched area P to the exclusion of areas W defined at the junction of two straight lines ($f_l$ and $f_u$ in FIG. 8) and resonant frequency characteristic curves ($n=1, 3, 5 \ldots$). In other words, the thickness d of the X-cut LiTaO$_3$ piezoelectric substrate may be selected in a range of $$\frac{2.13n}{f_l} < d < \frac{2.13(n+2)}{f_u}$$

Where n denotes an odd number of $1, 3, 5, 7 \ldots$.

Figure 9:
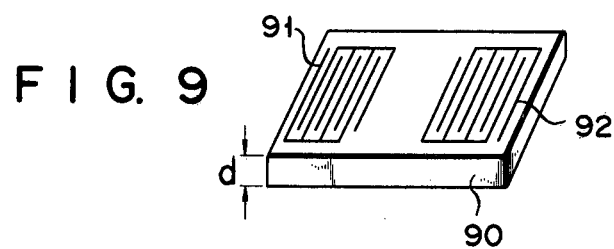
FIG. 9 is a perspective view showing one embodiment of this invention.

FIG. 9 is a diagrammatic perspective view showing an elastic surface wave device as used as a PIF filter of a color TV receiver. An X-cut LiTaO$_3$ piezoelectric substrate 90 of a thickness d of 0.330 mm is used as a piezoelectric substrate and input and output transducers 91 and 92 are both provided at a predetermined interval on one surface of the substrate. In this case, the direction of propagation of surface waves as defined between the input and output transducers 91 and 92 is made, for example, at an angle of 112° to the Y-axis of the substrate.

Figure 10:
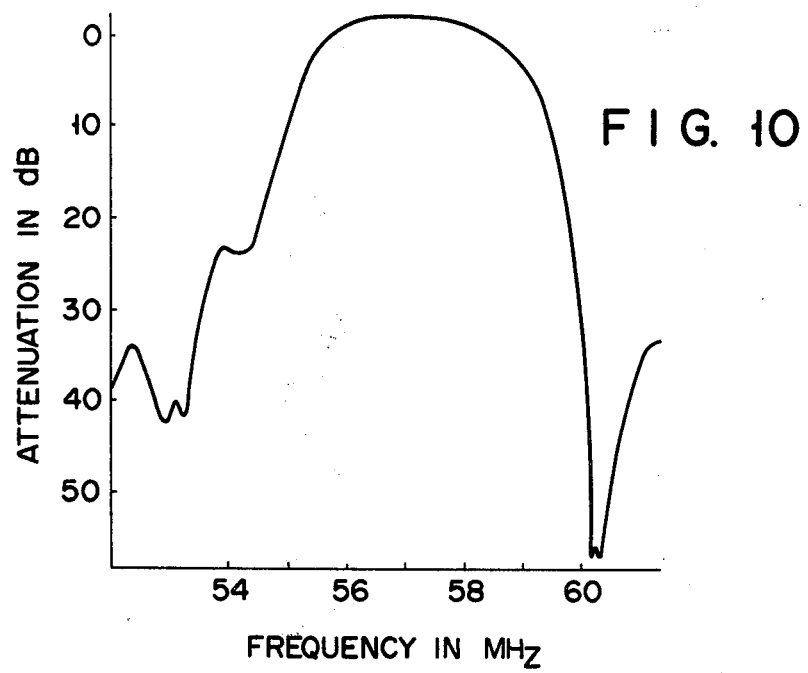
FIG. 10 shows a frequency characteristic curve of the embodiment of FIG. 9.

FIG. 10 shows the attenuation-frequency characteristic of the PIF filter of FIG. 9. From this it will be evident that the spurious components are properly suppressed within the pass band of 54 MHz to 60 MHz. The fact that if the direction of propagation of surface waves is selected to be made at 67° to 142° to the Y-axis of the substrate an excellent temperature characteristic is obtained is already disclosed in U.S. patent application Ser. No. 779,908 filed Mar. 21, 1977, now abandoned.

The spurious components can be beforehand prevented by restricting the thickness d of the substrate to within a certain range. The elimination of spurious components is further enhanced by using the following means. This is done by decreasing Q of resonance (the quality of the circuit) such that the resonance effect does not enter into the filter pass band and in consequence the thickness shear mode of the X-cut substrate imparts no adverse influence to the characteristic of the surface wave filter.

Figure 6A:
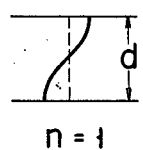
FIGS. 6A to 6D are views showing a relation of the order n of resonant frequencies to the displacement distribution of a thickness vibration in the X-axis direction.
Figure 6B:
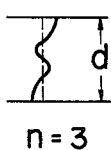
Figure 6C:
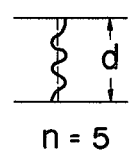
Figure 6D:
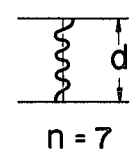
Figure 11:
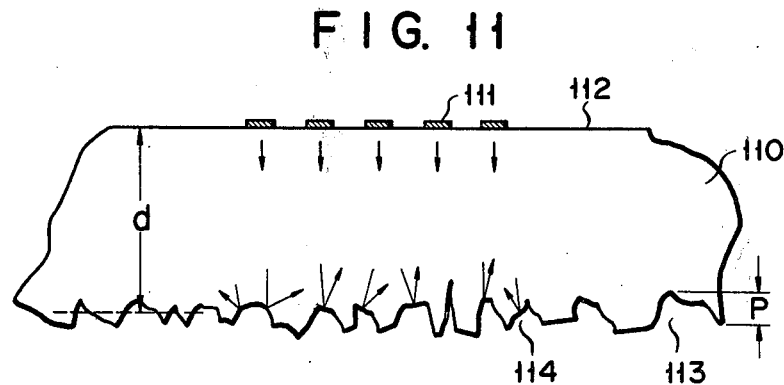
FIG. 11 is a representation showing a modified substrate configuration of this invention.

As a means for decreasing Q of resonance is to set the thickness d of the X-cut LiTaO$_3$ substrate 110 at a value satisfying the expression $$\frac{2.13n}{f_l} < d < \frac{2.13(n+2)}{f_u}$$

and to form a plurality of irregular indentations on the substrate surface opposite to that on which, for example, an input transducer 111 is formed. When a bulk wave produced from the input transducer is incident onto the indentations on the back surface 113 of the substrate 110 as shown in FIG. 11, a diffused reflection occurs if a difference between the crest and the valley of the indentation, i.e. a pitch, is one-fourth or more of the wavelength of the incident wave. Since as shown in FIG. 6A a relation of the wavelength of the vibration mode to the thickness d of the substrate at $n=1$ is $d=\lambda/2$, $\lambda=2d$. In consequence, the wavelength ($\lambda_n$) of the n-order wave becomes $$\lambda_n = 2d/n$$

and it is necessary that the pitch P of the indentation 114 be one-fourth of the above-mentioned wavelength i.e.

$$P = \frac{2d}{n} \cdot \frac{1}{4} = \frac{d}{2n}.$$

From the above-mentioned relation of $$f_{rn} d = 2.13n$$

it is required that a necessary minimum pitch P of the indentation 114 be $$P = \frac{d}{2n} = \frac{2.13n}{2n} \cdot \frac{1}{f_{rn}} = \frac{2.13}{2} \cdot \frac{1}{f_{rn}}$$

That is, a pitch of above this value is necessary. The requisite pitch P of the indentation 114 with respect to the lower limit frequency $f_l$ of the filter pass band is given by $$P > \frac{1}{f_l} \text{ (mm)}$$

Consider, for example, the PIF filter of the color television receiver. If in this case $f_l = 54$ MHz, then the pitch P is selected to be in a range of 15 to 20$\mu$. The indentation 114 was formed using, for example, carborundum #200 known as a polishing agent and a good result was obtained.

The resonant frequency $f_{rn}$ of the thickness shear mode of the X-cut LiTaO$_3$ substrate is given by $$f_{rn} = 2.13n/d$$

The wavelength of the shear mode at this time is found from $$\tfrac{1}{2}(n)\lambda_n = d$$

In consequence, one-fourth the wavelength becomes $$\tfrac{1}{4}\lambda_n = \tfrac{1}{2} d \cdot \tfrac{1}{n} = \tfrac{1}{2} \cdot \tfrac{d}{n}$$

Since from the preceding expression d/n is equal to $$2.13/f_{rn}, \tfrac{1}{2} \cdot \tfrac{d}{n} = \tfrac{1}{2} \cdot \tfrac{2.13}{f_{rn}} = \tfrac{2.13}{2} \cdot \tfrac{1}{f_{rn}}.$$

In order to prevent the bulk mode from being scattered onto the back surface 113 of the substrate and prevent consequent resonance, it is necessary that the pitch P of the indentation 114 on the back surface 113 of the substrate be more than $$\frac{2.13}{2} \cdot \frac{1}{f_{rn}} \text{ (mm)}$$

Regarding the resonant frequency $f_{rn}$, it is only necessary to give consideration to the PIF filter pass band and in consequence the center frequency $f_o$ (MHz). From this the pitch P is effective to be more than $$P = \frac{2.13}{2} \cdot \frac{1}{f_o}$$

The foregoing is substantially in agreement with the results of tests.

When the pitch P of the indentation formed on the substrate surface opposite to that on which the input and output transducers are formed is selected to be above $1/f_o$(mm) ($f_o$: incident frequency MHz), an elastic surface wave device free from spurious components can be obtained having a more improved characteristic than that as shown in FIG. 10.

What we claim is:

1. An elastic surface wave device comprising an X-cut LiTaO$_3$ piezoelectric substrate whose thickness d satisfies the following expression $$\frac{2.13n}{f_l} < d < \frac{2.13(n+2)}{f_u}$$

where n: an odd number of 1, 3, 5, 7 . . .
$f_l$: a minimum frequency (MHz) of a filter pass band
$f_u$: a maximum frequency (MHz) of a filter pass band
d: a thickness (mm) of the LiTaO$_3$ substrate and transducers formed on one surface of the substrate.

2. An elastic surface wave device according to claim 1, in which the direction of propagation of an elastic surface wave on the substrate is set at an angle of 67.8° to 142° to the Y-axis of the substrate.

3. An elastic surface wave device according to claim 2 in which a plurality of indentations are formed on the substrate surface opposite to that on which the transducers are formed, an average pitch P of the indentations being given by $$P \geq \frac{2.13}{2} \cdot \frac{1}{f_o} \text{ (mm)} .$$

4. An elastic surface wave device according to claim 1 in which a plurality of indentations are formed on the substrate surface opposite to that on which the transducers are formed, an average pitch P of the indentations being given by $$P \geq \frac{2.13}{2} \cdot \frac{1}{f_o} \text{ (mm)} .$$

* * * * *